(12) United States Patent
Van Sinderen

(10) Patent No.: US 6,862,327 B2
(45) Date of Patent: Mar. 1, 2005

(54) AGC CIRCUIT

(75) Inventor: Jan Van Sinderen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 687 days.

(21) Appl. No.: 09/898,283

(22) Filed: Jul. 3, 2001

(65) Prior Publication Data

US 2002/0015458 A1 Feb. 7, 2002

(30) Foreign Application Priority Data

Jul. 11, 2000 (EP) .......................................... 00202460

(51) Int. Cl.⁷ .............................................. H04L 27/08
(52) U.S. Cl. ................. 375/345; 455/234.1; 455/245.1; 330/278; 342/92
(58) Field of Search ....................... 375/345; 455/234.1, 455/245.1, 247.1, 250.1; 330/278; 342/92

(56) References Cited

U.S. PATENT DOCUMENTS

| | | | | |
|---|---|---|---|---|
| 4,774,474 A | | 9/1988 | Beauducel et al. ......... 330/129 |
| 4,806,914 A | * | 2/1989 | Thomas et al. ............. 340/680 |
| 5,036,527 A | * | 7/1991 | Halim et al. ................ 375/345 |
| 5,086,437 A | * | 2/1992 | Tomita ....................... 375/345 |
| 6,018,554 A | * | 1/2000 | Glover ....................... 375/345 |
| 6,072,997 A | * | 6/2000 | Kawai ........................ 455/214 |
| 6,408,168 B1 | * | 6/2002 | Sessink ................... 455/250.1 |

* cited by examiner

Primary Examiner—Temesghen Ghebretinsae

(57) ABSTRACT

An automatic gain control (AGC) circuit includes a digitally-controlled amplifier having a gain control loop including a level detector, a threshold circuit and a digital gain control signal generator coupled to a gain control input of the digitally-controlled amplifier for supplying thereto a digital gain control signal. To prevent astable gain settings of the digitally-controlled amplifier from occurring, a continuously-controlled amplifier is coupled between an output of the digitally-controlled amplifier and the level detector, an output of the level detector being coupled to a gain control input of the continuously-controlled amplifier for supplying thereto a continuous gain control signal, the gain variation range of the continuously-controlled amplifier at least corresponding to the gain step variation of the digitally-controlled amplifier at an incremental step of the digital gain control signal.

9 Claims, 2 Drawing Sheets

AGC CIRCUIT

BACKGROUND OF THE INVENTION

1. Field of the Invention

Figure 1:
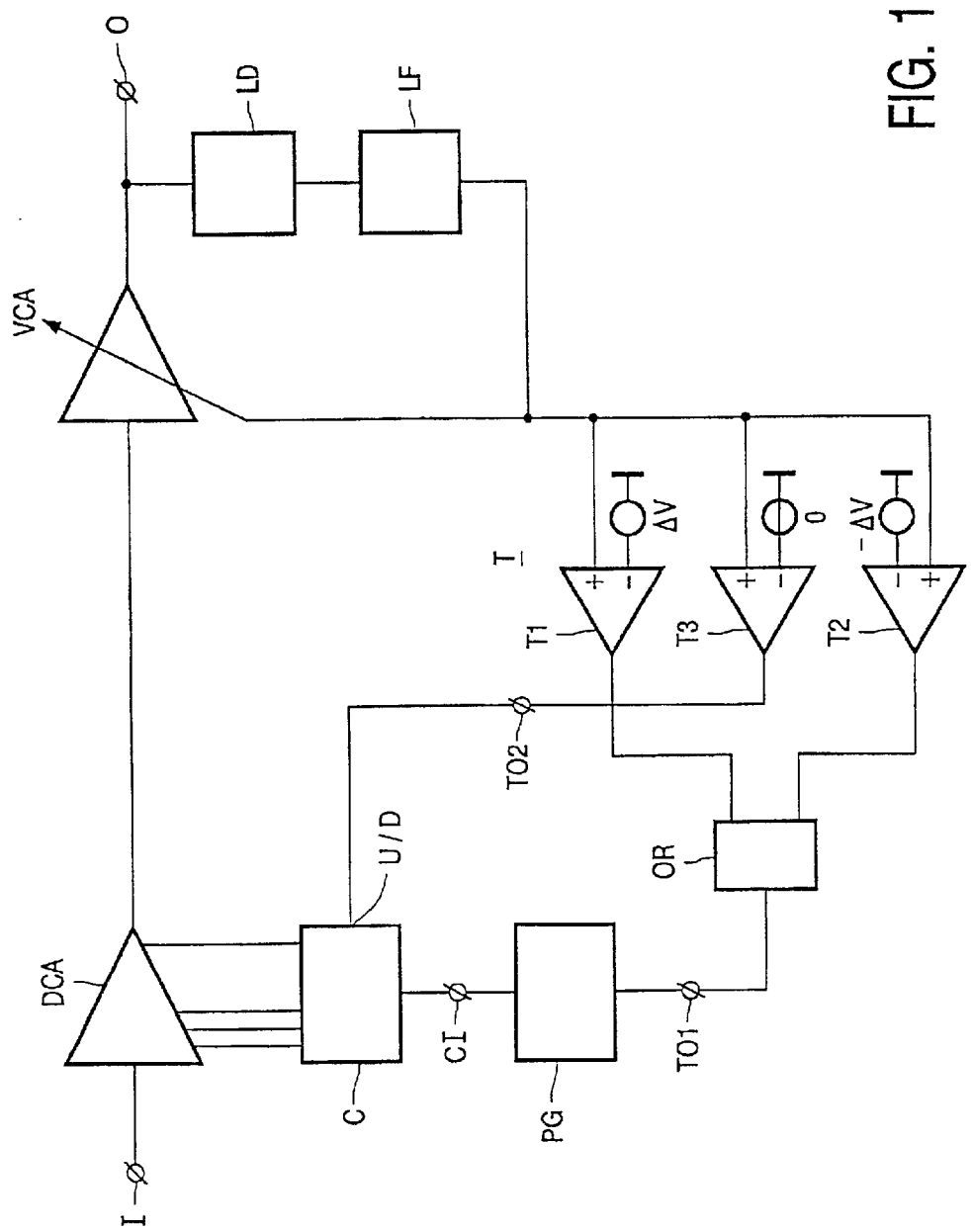

The invention relates to an automatic gain control (AGC) circuit comprising a digitally-controlled amplifier having a gain control loop including a level detector, a threshold circuit and a digital gain control signal generator coupled to a gain control input of the digitally controlled amplifier for supplying thereto, a digital gain control signal, as well as to a digital audio broadcast (DAB) receiver comprising such an AGC circuit.

2. Description of the Related Art

An AGC circuit of this kind is known, e.g., from U.S. Pat. No. 4,774,474. The known AGC provides for an automatic digital, gain setting of the digitally-controlled amplifier, such that the output signal is stabilized at a particular predetermined level. The digitally-controlled amplifier may comprise a number of gain stages in series and/or parallel, which can be switched off and on, depending on the gain setting required to stabilize the output signal level. Each gain stage can be optimized for linearity, signal-to-noise ratio and gain within its working area. This allows optimization of the digitally-controlled amplifier at small input signal amplitudes for proper signal-to-noise ratio at high gain factor. The digitally-controlled amplifier can be optimized at large input signal amplitudes for accurate linearity and low gain factor.

However, small deviations around the switching levels of the known digital gain control signal give rise to repeated switching between two gain settings. This modulates the output signal of the digitally-controlled amplifier, thereby causing an increase in the bit error rate, which may cause, e.g., audible distortions to occur.

SUMMARY OF THE INVENTION

Therefore, it is an object of the invention to stabilize the gain setting and to avoid said repeated switching between gain settings.

An AGC circuit comprising a digitally-controlled amplifier having a gain control loop including a level detector, a threshold circuit and a digital gain control signal generator being coupled to a gain control input of the digitally-controlled amplifier for supplying a digital gain control signal, according to the invention is, therefore, characterized in that the AGC circuit further comprises a continuously-controlled amplifier coupled between an output of the digitally-controlled amplifier and the level detector, an output of the level detector being coupled to a gain control input of the continuously-controlled amplifier for supplying a continuous gain control signal, the gain variation range of the continuously-controlled amplifier at least corresponding to the gain step variation of the digitally-controlled amplifier at an incremental step of said digital gain control signal.

By applying the measure according to the invention, a course gain setting is obtained with the digitally-controlled amplifier, whereas a continuous gain setting is obtained with the continuously-controlled amplifier. By choosing the gain variation range of the continuously-controlled amplifier to correspond at least to the gain step variation of the digitally-controlled amplifier at an incremental step of said digital gain control signal, repeated switching between gain settings are avoided.

To stabilize the gain loop against oscillation, the AGC circuit further comprises, preferably, a loop filter is coupled between the output of the level detector, on the one hand, and the gain control input of the continuously-controlled amplifier and the threshold circuit, on the other hand.

A further preferred embodiment of the AGC circuit, allowing for a cost-effective implementation, is characterized in that the threshold circuit comprises first and second comparators for comparing the output signal of the level detector with positive and negative threshold levels around a zero level for initiating the digital gain control signal generator for a stepwise variation of the gain of the digitally-controlled amplifier.

Preferably, the digital gain control signal generator comprises a pulse generator coupled to a clock-signal input of a digital counter for supplying a clock-signal thereto, the threshold circuit including a third comparator for comparing the output signal of the level detector with a zero level, and an output of the third comparator being coupled to an up/down input of the counter.

Another preferred embodiment of the AGC circuit according to the invention, is characterized in that the gain variation range of the continuously-controlled amplifier, caused defined by the range of the continuous gain control signal between the negative and positive threshold levels, corresponds at least to a gain variation of the digitally-controlled amplifier exceeding the value for one incremental step, preferably over two or more consecutive incremental steps, of said digital gain control signal. This further secures the prevention of repeated switching between two gain settings.

A receiver for digitally modulated signals, for example, a digital audio broadcast (DAB) receiver, comprising an AGC circuit according to the invention is characterized in that said digitally-controlled amplifier is coupled between an RF input filter and a phase quadrature mixer stage, phase quadrature outputs thereof being coupled through frequency selective means to a pair of phase quadrature continuously-controlled amplifiers, this pair of phase quadrature continuously-controlled amplifiers being coupled through to a pair of phase quadrature analog-to-digital converters to said level detector.

Figure 2:
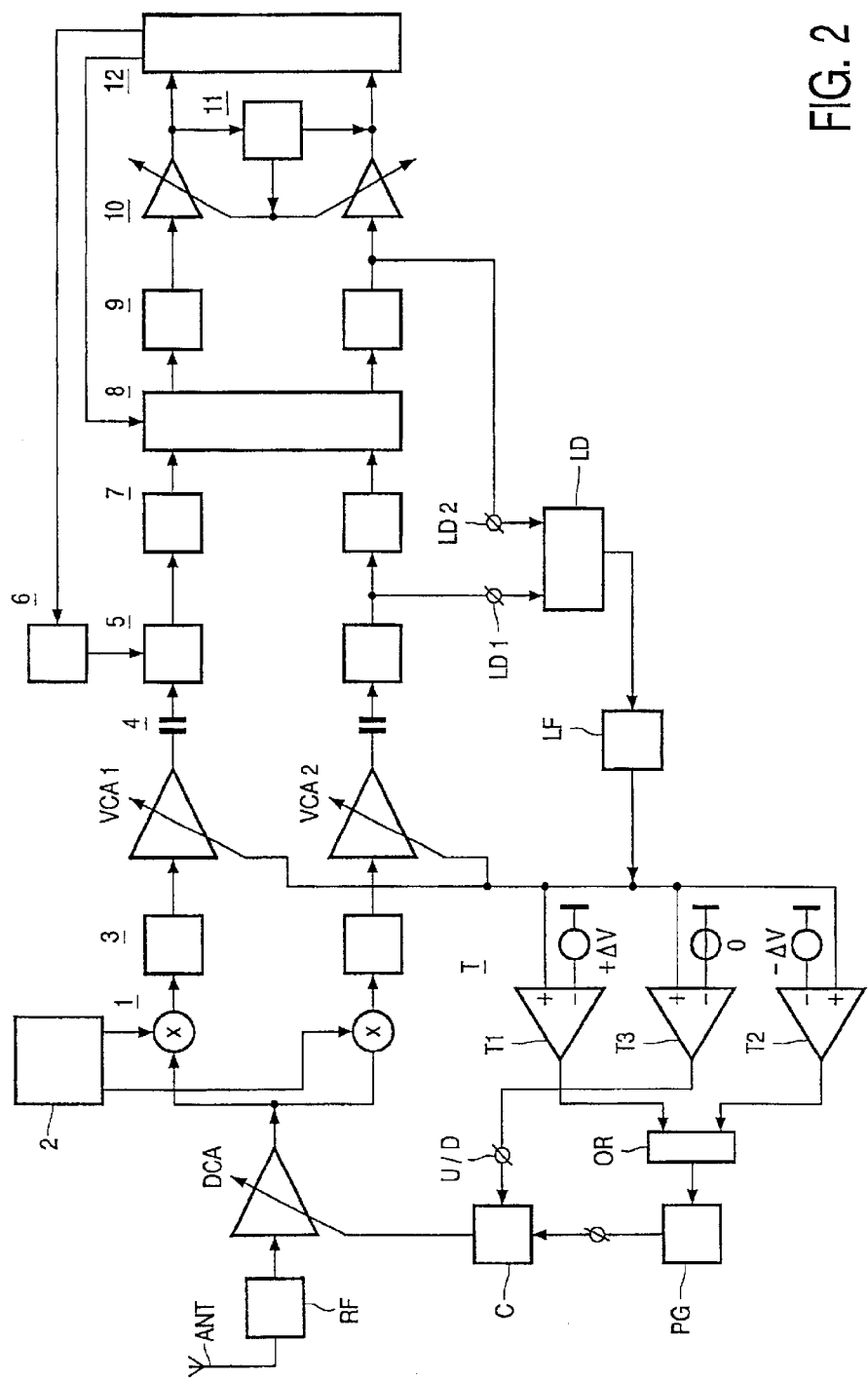

The invention will now be described with reference to the accompanying drawings, in which:

FIG. 1 shows a preferred embodiment of an AGC circuit according to the invention; and FIG. 2 shows a preferred embodiment of a DAB receiver using an AGC circuit according to the invention.

The figures are not drawn to scale. In general, like reference numerals refer to like parts.

DETAILED DESCRIPTION OF PREFERRED EMBODIMENTS

FIG. 1 shows a preferred embodiment of an automatic gain control (AGC) circuit according to the invention comprising a digitally-controlled amplifier DCA followed by a continuously-controlled amplifier VCA, an output thereof being coupled to a gain control loop including, subsequently, a level detector LD and a loop filter LF. An output of the loop filter LF is coupled to a gain control input of the continuously-controlled amplifier VCA for supplying thereto an continuous gain control signal, as well as to a threshold circuit T. A first output TO1 of the threshold circuit T is coupled, via a pulse generator PG, to a clock signal input CI of a digital counter C, and a second output TO2 of the threshold circuit T is coupled to an up/down control input U/D of said digital counter C. The digital counter C supplies a digital gain control signal to the digitally-controlled amplifier DCA. The pulse generator PG and said digital counter C therewith function as a digital gain control signal generator.

The gain variation range of the continuously-controlled amplifier VCA corresponds at least to the gain step variation of the digitally-controlled amplifier DCA at an incremental step of said digital gain control signal.

The threshold circuit T comprises first to third comparators T1–T3, the first and second comparators T1 and T2 being used to compare the output signal of the loop filter LF, respectively, with positive and negative threshold levels Vtp and Vtn around a zero level V0, and the third comparator T3 being used to compare the output signal of the level detector with a zero level. Therefore, the first to third comparators T1–T3 are each provided with positive and negative inputs, said positive inputs being coupled in common to the output of the loop filter LF, the negative inputs of the first and second comparators T1 and T2 being coupled, through respective positive and negative threshold voltage sources Vtp=+ΔV and Vtn=−ΔV, to ground, and the negative input of the third comparator T3 being coupled, through a zero voltage source (current source), to ground. Outputs of the first and second comparators T1 and T2 are coupled, through an OR-gate OR, to the first output TO1 of the threshold circuit T, an output of the third comparator T3 being coupled, via the second output TO2 of the threshold circuit T, to the up/down control input U/D of the digital counter C.

If the output signal of the loop filter LF increases above the positive threshold level Vtp, then the first comparator T1 causes the pulse generator GP to generate and supply a clock pulse to the counter C. If the output signal of the loop filter LF decreases below the negative threshold level Vtn, then the second comparator T2 causes the pulse generator GP to generate and supply a clock pulse to the counter C. The third comparator T3 controls the digital counter C to count down at the reception of a clock pulse from the pulse generator PG when the output signal of the loop filter LF increases above the positive threshold level Vtp. The third comparator T3 controls the digital counter C to count up at the reception of a clock pulse from the pulse generator PG when the output signal of the loop filter LF decreases below the positive threshold level Vtn. The range between positive and negative threshold levels Vtp and Vtn defines the range in which the output signal of the loop filter LF, i.e., the continuous gain control signal for the continuously-controlled amplifier VCA, may vary without changing the gain setting of the digitally-controlled amplifier DCA.

By choosing, in accordance with the invention, the gain variation range of the continuously-controlled amplifier VCA to correspond at least to the gain step variation of the digitally-controlled amplifier DGA at an incremental step of said digital gain control signal, i.e., the gain increase occurring in the digitally-controlled amplifier DGA at an up-count of one clock-pulse and/or the gain decrease occurring at a down-count of one clock-pulse, astable gain settings of the digitally-controlled amplifier DGA are avoided.

Preferably, the gain variation range of the continuously-controlled amplifier VCA is chosen to correspond to a gain variation of the digitally-controlled amplifier DGA exceeding the value for one incremental step, preferably, over two or more incremental steps, of said digital gain control signal. This further secures the avoidance of repeated switching of the gain of the digitally-controlled amplifier DGA between two gain settings.

However, overshoot in the gain control of the digitally-controlled amplifier DCA by superposition of subsequent gain step variations may occur, when the time between two consecutive clock-pulses decreases below a certain value, which is defined by the time-constant of the AGC loop. This can be prevented by appropriately limiting the speed of the pulse generator PG.

Furthermore, the time-constant of the loop filter LF is chosen sufficiently large to prevent regenerative feedback of the gain control signal of the continuously-controlled amplifier VCA.

FIG. 2 shows a preferred embodiment of a DAB receiver using an AGC circuit according to the invention, comprising the above-mentioned digitally-controlled amplifier DCA coupled between an RF input filter RF and a phase quadrature mixer stage 1. Phase quadrature outputs of the phase quadrature mixer stage 1 are coupled through phase quadrature frequency selective means 3 to a continuously-controlled phase quadrature amplifier VCA. This continuously-controlled phase quadrature amplifier VCA is coupled through a pair of blocking capacitors 4 to a phase quadrature analog-to-digital converter 5. Outputs of the phase quadrature analog-to-digital converter 5 are coupled through a phase quadrature decimation filter 8 to a CORDIC mixer 8, followed by a phase quadrature DAB channel filter 9. Phase quadrature outputs of the phase quadrature DAB channel filter 9 are coupled through an AGC-controlled phase quadrature amplifier 10 to phase quadrature inputs of a Fast Fourrier Transform device 12, a signal output thereof supplying a desired base-band DAB modulation signal, a first control output thereof supplying a frequency control signal to the CORDIC demodulator 8, and a second control output thereof supplying a time synchronization signal to a clock-signal generator 6. The clock-signal generator 6 supplies a clock-signal to the phase quadrature analog-to-digital converter 5.

The signal processing of a DAB receiver as provided by the circuitry 1–12 is on itself known, e.g., from U.S. Pat. No. 6,021,165. For a proper understanding of the present invention, detailed knowledge thereof is not required. For this reason, no further details with regard to said DAB receiver circuitry will be given.

In the DAB receiver as shown in this FIG. 2, the digitally-controlled amplifier DCA functions as a broadband amplifier, whereas the continuously-controlled phase quadrature amplifier VCA is functioning as a narrow-band amplifier. The level of the phase quadrature output signal of the continuously-controlled phase quadrature amplifier VCA is detected at two specific locations in the phase quadrature receiver signal path, namely, at the output of the phase quadrature frequency selective means 9 and at an output of the phase quadrature analog-to-digital converter 5. The level detector LD combines these two level informations into a single gain control signal reflecting, properly, the level of the phase quadrature output signal of the continuously-controlled phase quadrature amplifier VCA.

Preferably, the AGC circuit according to the invention is applied in receivers for digitally modulated signals, like DAB, GSM, DCS, UMTS, DECT, Bluetooth, etc., which are relatively insensitive to level changes by steps during reception.

The AGC circuit used in the DAB receiver as shown corresponds in its operation with the one described under FIG. 1.

It should be apparent that various changes may be made in the present invention as presented in FIGS. 1 and 2 without departing from the spirit and scope of the invention.

What is claimed is:

1. An automatic gain control (AGC) circuit comprising:
a digitally-controlled amplifier having a gain control loop including a level detector, a threshold circuit and a digital gain control signal generator coupled to a gain control input of the digitally-controlled amplifier for supplying thereto a digital gain control signal, characterized in that said AGC circuit further comprises:
a continuously-controlled amplifier coupled between an output of the digitally-controlled amplifier and the level detector, an output of the level detector further being coupled to a gain control input of the continuously-controlled amplifier for supplying thereto an continuous gain control signal, the gain variation range of the continuously-controlled amplifier at least corresponding to a gain step variation of the digitally-controlled amplifier at an incremental step of said digital gain control signal.

2. The AGC circuit as claimed in claim 1, characterized in that said AGC circuit further comprises:
a loop filter being coupled between the output of the level detector, and the gain control input of the continuously controlled amplifier and an input of the threshold circuit.

3. The AGC circuit as claimed in claim 1, characterized in that the threshold circuit comprises first and second comparators for comparing an output signal of the level detector with positive and negative threshold levels around a zero level for initiating the digital gain control signal generator for a stepwise variation of the gain of the digitally-controlled amplifier.

4. The AGC circuit as claimed in claim 3, characterized in that the digital gain control signal generator comprises a pulse generator coupled to a clock-signal input of a digital counter for supplying a clock-signal thereto, the threshold circuit including a third comparator for comparing the output signal of the level detector with a zero level, an output of the third comparator being coupled to an up/down input of the counter.

5. The AGC circuit as claimed in claim 3, characterized in that the gain variation range of the continuously-controlled amplifier defined by a range of the continuous gain control signal between the negative and positive threshold levels, corresponds at least to the gain variation of the digitally-controlled amplifier over two consecutive incremental steps of said digital gain control signal.

6. The AGC circuit as claimed in claim 4, characterized in that the time period between two consecutive clock pulses of the clock-signal is chosen sufficiently large to prevent superposition of subsequent gain step variations of the digitally-controlled amplifier from occurring.

7. The AGC circuit as claimed in claim 2, characterized in that a time-constant of the loop-filter is chosen sufficiently large to prevent regenerative feedback of the gain control signal in the AGC loop from occurring.

8. A receiver for digitally-modulated signals comprising an AGC circuit as claimed in claim 1, characterized in that said receiver further comprises:
an RF input filter for receiving digitally-modulated signals, the digitally-controlled amplifier of said AGC circuit being coupled to an output of said RF input filter;
a phase quadrature mixer stage coupled to the output of said digitally-controlled amplifier;
respective frequency selective means coupled to phase quadrature outputs of said phase quadrature mixer stage;
a pair of phase quadrature continuously-controlled amplifiers forming said continuously-controlled amplifier of said AGC circuit; and
respective analog-to-digital converters coupling said pair of phase quadrature continuously-controlled amplifiers to the level detector of said AGC circuit.

9. The receiver as claimed in claim 8, characterized in that the receiver is a DAB receiver.

* * * * *